Sept. 10, 1935. B. KJELLGREN Re. 19,697

METHOD OF PRODUCING PIEZO ELECTRIC CRYSTALS

Original Filed May 19, 1928

INVENTOR.

BY Bengt Kjellgren

Ray A. Eckhardt

ATTORNEY.

Reissued Sept. 10, 1935

Re. 19,697

UNITED STATES PATENT OFFICE 19,697

METHOD OF PRODUCING PIEZO-ELECTRIC CRYSTALS

Bengt Kjellgren, Cleveland Heights, Ohio, assignor to The Brush Development Company, Cleveland, Ohio, a corporation of Ohio Original No. 1,906,757, dated May 2, 1933, Serial No. 279,176, May 19, 1928. Renewed June 29, 1932. Application for reissue May 1, 1935, Serial No. 19,269

23 Claims. (Cl. 23—1)

This invention relates to the production of crystals such as Rochelle salt crystals suitable for use in the construction of piezo-electric devices.

An object of the invention is to provide a method of growing such crystals which is adapted to produce large clear homogeneous crystals and particularly such crystals of Rochelle salt.

Another object of the invention is to provide a method whereby such crystals can be produced in a comparatively short period of time.

A further object of this invention is to provide a simple and practical apparatus suitable for a large scale production of such crystals.

Another object is to provide a method of growing such crystals which will yield perfect symmetrical crystals of the desired shape without parasitic agglomerations of crystalline material attached thereto.

A further object of this invention is to provide a method whereby the proportions of a growing crystal may be modified or controlled.

Other objects of the invention will be apparent to those skilled in the art from the description of it hereinafter given.

In the methods used at present for making large clear well developed crystals, the crystallization is carried out either by lowering the temperature of the crystallizing solution or by evaporation of the solvent. The crystallizing solution may be in movement or at rest.

If the crystallizing solution is at rest the time required for growing large clear crystals will be comparatively long due to the slow diffusion of saturated solution through the layer of weak solution surrounding the growing crystal, since if time is not allowed for this diffusion irregular growth takes place and mother liquor is occluded in the crystal, and when Rochelle salt crystals, for example, are being formed, crystals known as composite crystals will be formed. These crystals are those having "hour glass" structure at the ends thereof in which considerable mother liquor is occluded and the crystals are not solid crystalline material throughout.

If the crystallizing solution is in movement, the weak solution around the crystal is continuously replaced with strong solution, thus making it possible to grow solid clear crystals in a shorter time than in a solution at rest. However, difficulties are experienced in the present methods of circulating the solution, due to the tendency of mechanical vibrations to start parasitic crystals and in the case of corrosive solutions to the tendency of these solutions to attack the pumping or circulating mechanism and conducting pipes. Moreover, if the solution moves only in one direction there is a tendency of the crystals to grow larger on the sides from which the current is flowing as the saturated solution reaches those sides first.

I have found it particularly advantageous to grow large clear crystals from a crystallizing solution while it is in a to-and-fro movement in relation to the growing crystal. During this movement the orientation of the axes of the growing crystal in relation to the direction of said movement is preferably kept substantially unchanged. In other words, the crystal is maintained substantially fixed in relation to the direction of flow of the solution, or, as I briefly express it, stationary relative to the flow of the solution over the same. This method secures a comparatively rapid growth without distortion or irregular development of the crystal.

The progressive saturation of the solution necessary for the production of crystals may be produced either by evaporation of the solvent at a constant temperature, or by lowering the temperature without evaporation or by a combination of both. I prefer to produce the crystals by lowering the temperature of the solution because of its convenience, but the methods hereinafter outlined are equally applicable if the evaporation method is employed or a combination of the two.

I have also found that clear perfect crystals may be grown more rapidly by maintaining a predetermined hydrogen ion concentration not in the neutral range, which of course, can be controlled by the addition of a suitable acid or alkali. However, it will be understood that the hydrogen ion concentration must be such that the crystalline material in solution will not be precipitated. For the efficient production of clear Rochelle salt crystals I have found that the addition of an alkali, such as sodium or potassium hydroxide, for example, corresponding to a one-tenth normal solution of sodium or potassium hydroxide is advantageous in promoting the relatively rapid growth of clear crystals.

Since not only the speed of growth but also the shape and characteristics of growth of the crystal are influenced by the amount of the to-and-fro movement of the solution past the crystal being formed, it is essential to produce this to-and-fro movement in such a manner that it may be easily adjusted to the production of desired crystal characteristics. One of the most efficient means of doing this is by subjecting the trays containing the solution to a slow rocking motion, the amount of which is governed by the type of crystal that it is desired to produce from a certain type of seed. For example, if a crystal is desired having the C or major axis long with respect to the B or minor axis at right angles to the major axis, the rocking should be in such a direction that the solution will flow back and forth parallel to the C axis, in which case a crystal will be produced having the C axis relatively long as compared with the B axis. Similarly, if the rocking takes place so that the solution flows back and forth in the direction of the B axis, the tendency is to increase the dimension of the crystal being grown in the direction of the B axis.

Furthermore, two crystals grown from substantially identical seeds under identical conditions except that the rocking is greater in one case than in the other, will develop so that the one subjected to the greater rocking will be longer on the axis parallel to the direction of rocking than the other one. Also, if the depth of the crystallizing solution is not too great, and if the rocking is of an amount great enough so that the top of the crystal is left uncovered during a portion of the time, growth in the direction of the upright axis may be largely suppressed, yielding a flatter type of crystal.

Another advantage of the rocking is that if the cycle of movement is long enough the solution reverses itself very gradually and the tendency to produce ripples and high frequency agitations in the solution is reduced to a minimum. It is moreover desirable to produce the rocking by a slow uniform sinusoidal movement whereby the reversal of direction will take place very gradually so that there will be a minimum tendency to produce shocks or ripples in the solution. Means must also be provided for keeping the vibrations of the actuating mechanism of the rocker from reaching the crystallizing vessel.

The following is a description of my improved method of producing large clear crystals and of apparatus suitable for carrying out the method, the apparatus being illustrated in the accompanying drawing.

In Figure 1 is shown a vertical cross section of the apparatus used for production of the crystals.

Figure 1:
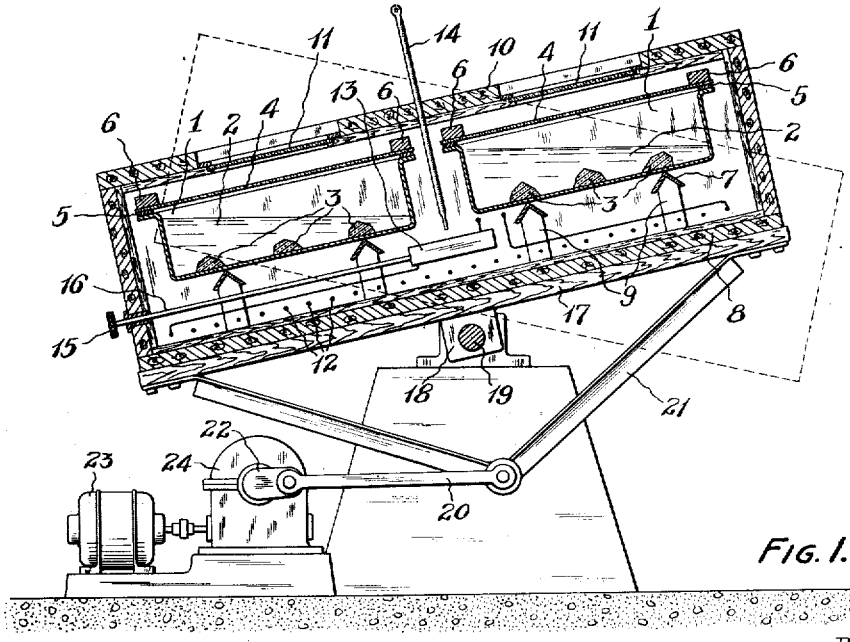
Figure 8:
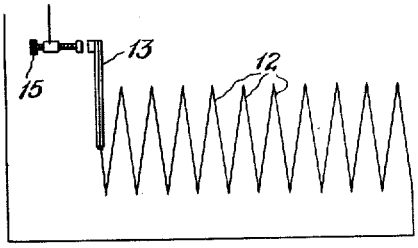
Fig. 8 is a diagrammatic view of the heating element and thermostat.

In Fig. 1 is shown a tray 1 which contains the crystallizing solution 2 and in which are mounted the seeds 3a from which the crystals 3 are grown. The tray is preferably covered with a suitable transparent cover 4 such as a sheet of glass which is supported on a suitable gasket 5, such as thick sponge rubber so that the tray is substantially airtight. The glass may be held into close contact with the gasket 5 by any suitable means such as weight 6 secured by cement, or otherwise, to the glass. The tray 1 is preferably mounted on suitable supports such as long angle iron supports 7, which are supported above the bottom of the box 8 by suitable members 9 so that the heating and temperature regulating apparatus may be mounted under the tray.

The top 10 of the box is preferably provided with an observation window 11 and the top is readily removable for access to the trays. The trays are preferably supplied with heat by any suitable means such as the electric heating element 12 which is disposed near the bottom of the box. The heat is supplied to replace heat lost by radiation so that the temperature may be controlled. The temperature is preferably automatically controlled by a suitable adjustable thermostat 13. A thermometer 14 may be provided for observing the temperature. The thermostat is indicated diagrammatically as this construction forms no part of this invention. A knob 15 on the rod 16 is shown for regulating the thermostat.

The box surrounding the tray is carefully insulated with cork or other suitable insulating material so that the temperature of the trays may be substantially uniform.

The box 8 is supported by a suitable platform 17 which in turn is mounted on bearings 18 which engage the shaft 19. The platform is given a rocking motion by the crank 22 which causes the rod 20 to move back and forth and this gives the platform a rocking motion by means of the arms 21 which are connected to the platform and to the rod 20. The crank 22 may be actuated by any suitable means such as an electric motor 23 and reducing gears 24.

The production of large clear Rochelle salt crystals in this rocking apparatus is described hereinafter as an example of how the apparatus may be used for crystallization by the to-and-fro movement of a crystallizing solution and a lowering of the temperature of the same whereby the desired precipitation may be obtained.

The box or oven containing the thoroughly cleaned and covered trays is first heated to predetermined temperature, for example, about 35 degrees C. and held at this temperature until conditions have become constant. A filtered Rochelle salt solution made alkaline corresponding to about 0.1 normality of sodium or potassium hydroxide and containing enough Rochelle salt to be slightly supersaturated at 35 degrees C. is heated to about 50 or 55 degrees C. and then poured into the trays and allowed to cool slowly by having the oven open and the heat shut off.

It is desirable to pour the solution into the trays at a temperature above the saturation temperature to prevent the formation of accidental crystals. Such crystals if formed at the pouring of the solution, for example by dust particles falling down on the surface of the solution, are rapidly dissolved on account of the high temperature. Moreover, it is also preferable to have the trays covered during the cooling period so as to protect the surface of the solution from the settling of dust particles and to prevent evaporation.

In order to start the growth of the crystals, pieces of the crystalline material usually known as seeds are cut or otherwise formed with suitable size, shape and orientation and are planted in the solution on the bottom of the tray, when the temperature has dropped for example to 5 or 10 degrees C. above the saturation temperature of the solution, i. e. to about 40 or 45 degrees C. for the above solution. To avoid cracking of the seeds at the planting they are preferably preheated to the planting temperature.

The exact amount of temperature above the saturation temperature at which the seeds are planted depends upon the rate of cooling of the solution, since if the seeds are subjected too long to the unsaturated solution they will entirely dissolve. It is preferable to plant the seeds at a temperature sufficiently high to dissolve a small part of the seeds while the solution is cooling down to the saturation temperature. The reason for this is that when the surface of the seed is slightly dissolved before it begins to grow, the seed and the crystal grow together more intimately. Moreover, if the surface of the seed is slightly dissolved, small parasitic crystals that may have been formed at the planting also are dissolved and thereby irregular crystallization is avoided.

After planting, the trays are covered so as to maintain an atmosphere saturated with moisture above the solution and prevent evaporation. This prevents crystallization at the surface of the solution.

When the temperature of the solution has dropped to the saturation temperature, or to slightly above this temperature, the top of the oven is put on and the motor 23 is started to rock the oven on the shaft 9, it being understood that the rocking motion is relatively slow and that the weight of the seeds is sufficient to hold them in substantially fixed position on the bottoms of the trays. The heat is then turned on, and the saturation temperature maintained for some time, for example, 6 to 12 hours, or until conditions in the solution are in equilibrium.

At this time a very slow reduction of the solution temperature is begun. The exact amount of this reduction depends upon the concentration and volume of the solution and the number and size of the seeds. For example, if 20 seeds of about 5 grams each are planted in a Rochelle salt solution of a specific gravity of 1.380 at 60 degrees C., and having a volume of 20 liters, the temperature may be dropped about 0.2 degree C. the first day. As the crystals grow larger the temperature may be dropped by a greater amount each day. For example, if crystals weighing about one pound apiece are produced in three weeks, the rate of temperature drop may be increased until at the last it is about 1.5 degrees per day, thus reducing the time required to grow the crystals to the desired size. If larger crystals are made, say two pound crystals, the rate of temperature drop may be increased still further. This increase is a function of the crystal surface per liter of solution.

The temperature drop is accomplished either by turning the thermostatic control knob 15 by hand at suitable intervals or by any suitable automatic mechanical device, for example, a timing mechanism.

It may also be noted that the heat is supplied beneath the tray containing the solution so that the lower portion of the solution will have a temperature slightly higher than the upper portion of the solution, and this is advantageous because it overcomes a tendency of the crystals to grow more rapidly at the bottom and raise themselves in the solution on an irregular crystalline formation.

When the crystals are of the desired size they are taken out, wiped off with a soft cloth and if further cleaning is desired rinsed in dilute alcohol.

Figure 7:
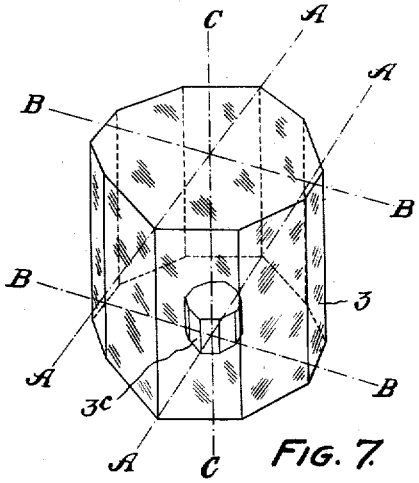
Figs. 6 and 7 are perspective views of two types of crystal grown by my process.
Figure 6:
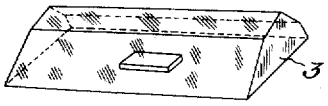

Crystals of a predetermined shape may be obtained from a crystalline fragment or seed. For example, by planting a seed, so that a plane going through its major or C axis and its minor or B axis is parallel with the bottom of the tray, a half developed crystal as shown in Fig. 6 is produced. On the other hand, a fully developed crystal or complete crystal is formed if the seed $3^c$ is planted so that a plane through its A and B axes is parallel to the bottom of the tray, as in Fig. 7. The proportions of the so formed crystal are greatly influenced by the proportions of the seed from which the crystal is grown. For example, a seed that is two inches long will always give a longer crystal than a seed one inch long, if both seeds are grown under the same conditions. But as before mentioned, the proportions of the grown crystal are also influenced by the frequency, amount and direction of the rocking. Therefore, it is possible, if desired, to grow, for example a long crystal from a short seed and a short or wide crystal from a comparatively long seed.

Figure 2:
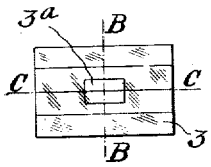
Figs. 2 and 3 are plan views of crystals grown from identical seeds with the minor or B axis parallel with the movement of the solution and illustrating the effect of variation in the amount of such movement.
Figure 3:
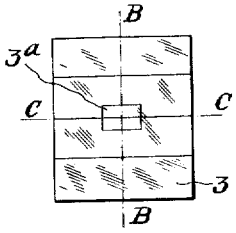
Figure 5:
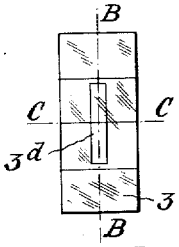
Figs. 4 and 5 are plan views of crystals grown from seeds of identical geometrical dimensions but differing in orientation in relation to their shape and illustrating effects of variation of such orientation.
Figure 4:
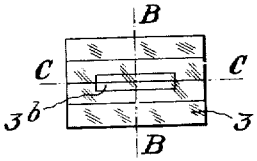

Figs. 2 and 3 illustrate two crystals grown from identical seeds $3^a$. In Fig. 2 the C axis is longer than the B axis, while in Fig. 3 the C axis is shorter than the B axis. This difference in the proportions of the crystal is due to the rocking to which the crystalline solution was subjected. Fig. 2 illustrates the effect of a small rocking motion parallel with the B axis and Fig. 3 the effect of a large rocking motion. Thus rocking tends to increase the dimensions of the crystal that is parallel with the movement. This fact can be utilized for making square, very wide or very long crystals. Fig. 4 illustrates a moderately wide crystal grown from a long, narrow seed $3^b$, while Fig. 5 shows a very short and very wide crystal grown from a seed $3^d$ having its length and width the same as the width and length, respectively, of the seed $3^b$, the motion of the solution in both cases being the same in amount and parallel to the B axis.

The production of crystals of desired proportions and orientation of crystalline axes is facilitated by the use of seeds of predetermined dimension and orientation which can be located in the trays with their axes in the desired relation to the direction of rocking.

It will thus be seen that by this method, I have provided an efficient procedure for controlling the growth and production of large solid clear well developed crystals of desired form.

Furthermore, it is to be understood that the particular forms of apparatus shown and described, and the particular procedure set forth, are presented for purposes of explanation and illustration and that various modifications of said apparatus and procedure can be made without departing from my invention as defined in the appended claims.

What I claim is:

1. The method of producing clear solid crystals, which consists in planting pieces of crystalline material in a concentrated solution of the crystalline material, imparting to the solution a movement backward and forward with respect to the pieces of crystalline material while maintaining said pieces substantially stationary relative to the flow of the solution thereover, and causing the solution to crystallize by permitting the temperature of the solution to drop.

2. The method of producing clear solid crystals of Rochelle salt, which consists in inserting pieces of crystalline material in a Rochelle salt solution, imparting to the solution a motion relative to the pieces of crystalline material while maintaining said pieces substantially stationary relative to the flow of the solution thereover, and keeping the solution supersaturated.

3. The method of producing clear solid crystals, which consists in placing pieces of crystalline material in a solution of isomorphous crystalline material, causing the solution to have a to-and-fro motion with respect to said pieces while maintaining said pieces substantially stationary relative to the flow of the solution thereover, and keeping the solution supersaturated.

4. The method of producing clear solid crystals, which consists in placing pieces of crystalline material in a solution of the said material, causing a motion of the solution toward and from said pieces while maintaining said pieces substantially stationary relative to the flow of the solution thereover and lowering the temperature of the solution at a progressively increasing rate adapted to maintain a predetermined degree of supersaturation of the solution.

5. The method of growing Rochelle salt crystals, which consists in planting pieces of crystalline material in a solution of Rochelle salt, rocking the solution while maintaining said pieces substantially stationary relative to the flow of the solution thereover, and causing the solution to crystallize.

6. The method of growing Rochelle salt crystals, which consists in placing pieces of crystalline material in a concentrated solution of Rochelle salt, rocking the solution while maintaining said pieces substantially stationary relative to the flow of the solution thereover, and lowering the temperature in progressively increasing amounts.

7. The method of growing crystals, which comprises placing a piece of crystalline material in a concentrated solution of the crystalline material, imparting movement to the solution in a direction parallel to a certain axis of the piece of crystalline material, supplying heat to the solution, and reducing the temperature at a predetermined rate.

8. The method of growing solid clear crystals, which comprises placing pieces of the crystalline material in a solution of the crystalline material, imparting a to-and-fro motion to the solution while maintaining said pieces substantially stationary relative to the flow of the solution thereover, and causing crystallization of the material by decreasing the temperature of the solution, whereby only regular crystallization occurs as the supersaturation of the solution tends to increase and solid clear crystals are formed.

9. The method of producing clear solid crystals of Rochelle salt, which comprises forming a piece of Rochelle salt crystalline material of predetermined shape and orientation, placing said piece in a solution of Rochelle salt, imparting to the solution a to-and-fro motion in a predetermined direction relative to the piece of crystalline material while maintaining said piece substantially stationary relative to the flow of solution thereover, and causing the solution to crystallize.

10. The method of producing clear solid crystals of Rochelle salt, which consists in inserting solid crystalline material in an alkaline Rochelle salt solution, and causing the solution to crystallize.

11. The method of producing clear solid crystals, which consists in inserting homogeneous crystalline material in an alkaline solution of the crystalline material, imparting to the solution a to-and-fro motion in a predetermined direction relative to the crystalline material, maintaining the crystalline material substantially stationary relative to the flow of the solution thereover, and keeping the solution supersaturated.

12. The method of producing clear solid crystals of Rochelle salt, which comprises forming a seed of isomorphous crystalline material of a predetermined shape and orientation, inserting said seed in a Rochelle salt solution of suitable hydrogen-ion concentration, imparting to the solution a to-and-fro motion parallel to an axis of the seed while maintaining the seed substantially stationary relative to the flow of the solution thereover, and causing the solution to crystallize.

13. The method of producing crystals, which consists in placing a piece of crystalline material in a solution of the crystalline material which is at a temperature above saturation temperature, reducing the temperature at least to the saturation point, and imparting to the solution a to-and-fro motion parallel to an axis of the piece of crystalline material.

14. The method of producing crystals which comprises placing a piece of crystalline material in a solution of said material which is at a temperature above the saturation point, permitting the piece of crystalline material to partially dissolve in the solution, imparting a to-and-fro motion to the solution relative to the piece of crystalline material while maintaining said piece substantially stationary relative to the flow of the solution thereover, rapidly reducing the temperature of the solution to the saturation point, and slowly reducing the temperature thereafter.

15. The method of growing crystals which comprises placing a piece of crystalline material on the bottom of a vessel holding a solution of said material, imparting to the solution a to-and-fro motion in a predetermined direction in relation to said piece of crystalline material while maintaining said piece substantially stationary relative to the bottom of the vessel, and causing the solution to crystallize.

16. The method of growing crystals, which comprises planting a piece of crystalline material in a solution of the crystalline material at a predetermined temperature above the saturation temperature, imparting to the solution a to-and-fro motion parallel to an axis of the piece of crystalline material, cooling the solution to the saturation temperature, and then further reducing the temperature of the solution at a predetermined rate.

17. The method of growing crystals which comprises placing a piece of crystalline material in a solution of said material, maintaining the lower portion of the solution at a somewhat higher temperature than the upper portion thereof, imparting to the solution a to-and-fro movement relative to the piece of crystalline material while maintaining the said piece substantially stationary relative to the flow of the solution thereover, and causing the solution to crystallize.

18. The method of producing clear solid crystals of sodium potassium tartrate which consists in inserting in a sodium potassium tartrate solution of a predetermined hydrogen ion concentration a seed of isomorphous crystalline material, imparting to the solution a to-and-fro motion in a direction parallel to an axis of said seed while maintaining the seed substantially stationary relative to the flow of solution thereover, and causing the solution to crystallize.

19. The method of producing clear solid crystals, which comprises forming a piece of crystalline material of predetermined shape and orientation, placing said piece in a solution of isomorphous crystalline material, imparting to the solution a to-and-fro motion in a predetermined direction relative to the piece of crystalline material while maintaining said piece substantially stationary relative to the flow of solution thereover, and causing the solution to crystallize.

20. The method of producing clear solid crystals of predetermined shape and orientation, which comprises forming a piece of crystalline material of predetermined shape and orientation, placing said piece in a solution of isomorphous crystalline material, imparting to the solution a to-and-fro motion in a direction parallel to an axis of the piece of crystalline material while maintaining the crystalline material substantially stationary relative to the flow of the solution thereover, and causing the solution to crystallize.

21. The method of producing crystals of predetermined shape and orientation, which comprises forming from a crystalline mass a seed portion with the major dimension of the seed parallel to the crystalline axis along which the larger dimension of the crystal to be formed is desired, planting said seed in a solution of isomorphous salt, and causing said solution to crystallize on said seed.

22. The method of producing crystals of predetermined shape and orientation, which comprises forming from a crystalline mass a seed portion with the major dimension of the seed parallel to the crystalline axis along which the larger dimension of the crystal to be formed is desired, planting said seed in a solution of isomorphous salt, imparting to the solution a to-and-fro motion in relation to the seed, and causing said solution to crystallize on said seed.

23. The method of producing crystals of predetermined shape and orientation, which comprises forming from a crystalline mass a seed portion with the major dimension of the seed parallel to the crystalline axis along which the larger dimension of the crystal to be formed is desired, planting said seed in a solution of isomorphous salt, imparting to the solution a to-and-fro motion parallel to the said crystalline axis, and causing said solution to crystallize on said seed.

BENGT KJELLGREN.